(12) United States Patent
Toyoda et al.

(10) Patent No.: US 10,811,464 B2
(45) Date of Patent: Oct. 20, 2020

(54) ORGANIC EL DISPLAY DEVICE

(71) Applicant: Japan Display Inc., Minato-ku (JP)

(72) Inventors: Hironori Toyoda, Minato-ku (JP); Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 48 days.

(21) Appl. No.: 15/841,679

(22) Filed: Dec. 14, 2017

(65) Prior Publication Data

US 2018/0175118 A1 Jun. 21, 2018

(30) Foreign Application Priority Data

Dec. 16, 2016 (JP) .................................. 2016-244639

(51) Int. Cl.
*H01L 27/32* (2006.01)
*H01L 51/52* (2006.01)

(52) U.S. Cl.
CPC ...... *H01L 27/3211* (2013.01); *H01L 27/3246* (2013.01); *H01L 51/5203* (2013.01); *H01L 51/5265* (2013.01); *H01L 51/5275* (2013.01); *H01L 2251/558* (2013.01)

(58) Field of Classification Search
CPC ............. H01L 27/3211; H01L 51/5265; H01L 51/5275; H01L 51/5203; H01L 27/3246; H01L 2251/558
See application file for complete search history.

(56) References Cited

U.S. PATENT DOCUMENTS

| | | | |
|---|---|---|---|
| 2008/0023724 A1 | 1/2008 | Takeda et al. | |
| 2011/0101855 A1* | 5/2011 | Mizuno | H01L 27/3211 313/504 |
| 2012/0032584 A1 | 2/2012 | Mizuno | |
| 2012/0286255 A1 | 11/2012 | Tanaka | |
| 2015/0243932 A1* | 8/2015 | Shiratori | H01L 51/5271 257/88 |
| 2016/0043154 A1 | 2/2016 | Choi et al. | |

(Continued)

FOREIGN PATENT DOCUMENTS

| | | |
|---|---|---|
| JP | 2006-302878 A | 11/2006 |
| JP | 2011-155002 | 8/2011 |

(Continued)

OTHER PUBLICATIONS

Notice of Reasons for Refusal dated Sep. 1, 2020, in Japanese Patent Application No. 2016-244639, filed Dec. 16, 2016 w/English-language Translation.

*Primary Examiner* — Mark W Regn
(74) *Attorney, Agent, or Firm* — Oblon, McClelland, Maier & Neustadt, L.L.P.

(57) ABSTRACT

An organic EL display device includes at least one light emitting unit that includes a first electrode, an organic film that includes a light emitting layer and is provided over the first electrode, and a second electrode that is provided over the organic film and transmits light from the light emitting layer, and an optical adjusting layer that covers the at least one light emitting unit. The optical adjusting layer in a first area that overlaps the at least one light emitting unit in a planar view and the optical adjusting layer in at least one second area that is adjacent to the first area are different from each other in at least one of a number of layers that the optical adjusting layer includes, a film thickness, and a refractive index.

6 Claims, 12 Drawing Sheets

(56) References Cited

U.S. PATENT DOCUMENTS

2016/0197308 A1*  7/2016  Jeong .................. H01L 51/5275
                                                257/40
2016/0240589 A1   8/2016  Jeong

FOREIGN PATENT DOCUMENTS

| JP | 2012-038555 A | 2/2012 |
| JP | 2012-054225 A | 3/2012 |
| KR | 2016-0060835 A | 5/2016 |

* cited by examiner

ORGANIC EL DISPLAY DEVICE

CROSS-REFERENCE TO RELATED APPLICATION

The present application claims priority from Japanese application JP2016-244639 filed on Dec. 16, 2016, the content of which is hereby incorporated by reference into this application.

BACKGROUND OF THE INVENTION

1. Field of the Invention

One or more embodiments of the present invention relate to an organic EL display device.

2. Description of the Related Art

In Japanese Patent Application Laid-Open No. 2011-155002, organic EL element is disclosed where a reflecting layer, a first electrode, a light emitting layer, and a second electrode are laminated in this order, and further an optical adjusting layer is provided on the second electrode.

SUMMARY OF THE INVENTION

On an organic EL display device, generally, a light emitting layer is provided in a planar form on a substrate. Thus, a luminance in a front direction is relatively strong, and a luminance in an oblique direction is relatively weak. Therefore, there is a case where it is desired to increase the luminance in the oblique direction and improve luminance/visual angle characteristics. Further, depending on a kind of use, there is a case where it is desired to decrease the luminance in the oblique direction, and it is desired to increase or decrease the luminance in the front direction.

The present invention has been made in view of the above issue, and the object thereof is to provide an organic EL display device with which desired luminance/visual angle characteristics can be obtained.

An organic EL display device includes at least one light emitting unit that includes a first electrode, an organic film that includes a light emitting layer and is provided over the first electrode, and a second electrode that is provided over the organic film and transmits light from the light emitting layer, and an optical adjusting layer that covers the at least one light emitting unit. The optical adjusting layer in a first area that overlaps the at least one light emitting unit in a planar view and the optical adjusting layer in at least one second area that is adjacent to the first area are different from each other in at least one of a number of layers that the optical adjusting layer includes, a film thickness, and a refractive index.

DETAILED DESCRIPTION OF THE INVENTION

Figure 1:
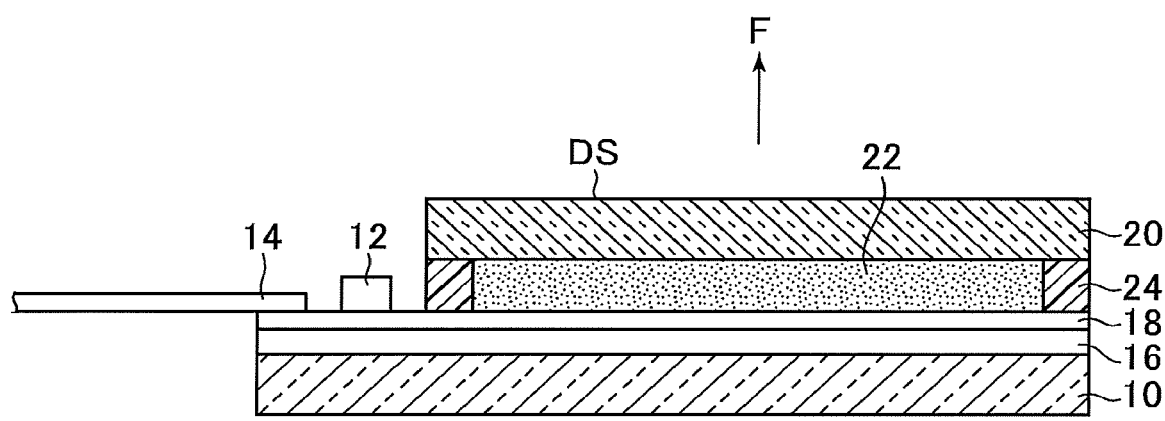
FIG. 1 is a cross sectional diagram of an organic EL display device according to an embodiment of the present invention.

Below, the respective embodiments of the present invention are explained with reference to the accompanying drawings. Note that the disclosed embodiments are merely examples, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those that have already been illustrated in another drawing, and a detailed explanation of such elements may be omitted as appropriate.

FIG. 1 is a cross sectional diagram of an organic EL (electroluminescence) display device according to an embodiment of the present invention. The organic EL display device has a first substrate 10. On the first substrate 10, an integrated circuit chip 12 to drive a pixel is mounted. To the first substrate 10, for an electric connection to the outside, a flexible wiring substrate 14 is connected. On the first substrate 10, a circuit layer 16 is formed that includes a thin film transistor, a wiring, and an insulating layer that are not illustrated. On the circuit layer 16, an element layer 18 is laminated. The details of the element layer 18 will be described later.

The organic EL display device has a second substrate 20. The second substrate 20 is disposed so as to be opposed to the first substrate 10 with a space therebetween. A filler 22 is provided between the first substrate 10 and the second substrate 20, and the filler 22 is surrounded and sealed by the sealing member 24. It may be configured that the second substrate 20 is not provided. Further, in the case where the second substrate 20 is provided if the second substrate 20 is fixed by the filler 22 or another means, it may be configured that the sealing member 24 is not necessarily provided. Further, in the case where the second substrate 20 is not provided, it may be configured to not provide the sealing member 24.

In the explanation below, it is provided that a direction in which the second substrate 20 is opposed to the first substrate 10 (the direction of arrow F in FIG. 1) is an upper direction. In the present embodiment, an upper surface of the second substrate 20 is a display surface DS, and a front face of the display surface DS is faced in the upper direction.

Figure 2:
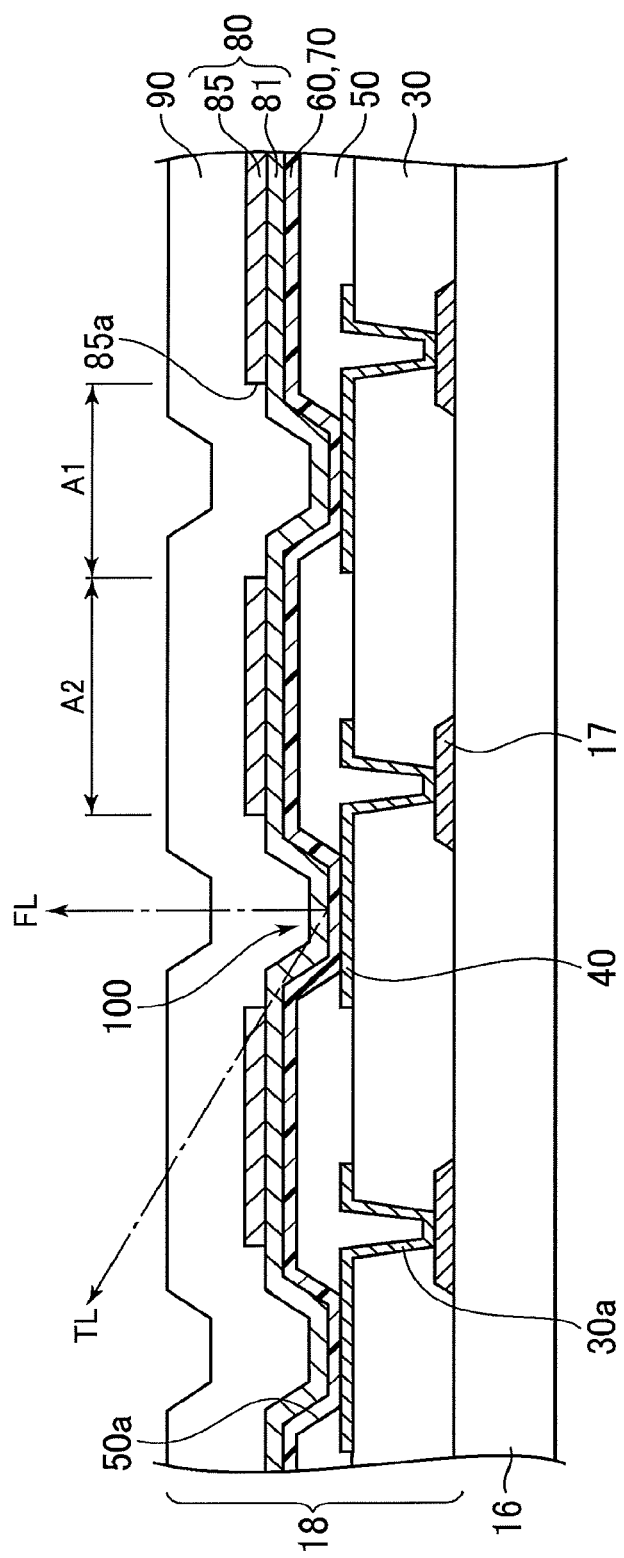
FIG. 2 is a diagram that illustrates an example of a cross sectional structure of an element layer.

FIG. 2 is a diagram that illustrates an example of a cross sectional structure of the element layer 18. In the figures that appear after this figure, in order to make it easy to see the cross sectional structure, hatchings of the circuit layer 16, a planarizing film 30, a bank 50, and a sealing film 90 are omitted.

The circuit layer 16 is covered by the planarizing film 30, and on the planarizing film 30 a first electrode 40 is disposed. On the planarizing film 30 a through hole 30a for connecting the first electrode 40 to a thin film transistor of the circuit layer 16 is formed. The planarizing film 30 is formed of, for example, an organic insulating material such as acrylic resin, and has a flat upper surface. The first electrode 40 is, for example, an anode, and is formed of metal such as aluminum, silver, copper, nickel, and titanium.

The planarizing film 30 and the first electrode 40 are covered by the bank 50. On the bank 50, an opening 50a is formed at the bottom of which the first electrode 40 exists. The bank 50 is referred to also as a pixel separation film, a rib, a partition wall, and the like, and is formed of an organic material such as acrylic resin. On the first electrode 40 that exists at the bottom of the opening 50a of the bank 50, an organic film 60 is laminated.

The bank 50 and the organic film 60 are covered by a second electrode 70. The second electrode 70 is, for example, a cathode, and is formed of a transparent conductive material such as magnesium silver (MgAg), indium zinc oxide (IZO), and indium tin oxide (ITO).

The second electrode 70 is covered by an optical adjusting layer 80. The details of the optical adjusting layer 80 will be described later. The optical adjusting layer 80 is covered by the sealing film 90. The sealing film 90 is formed of an inorganic insulating material such as silicon oxide and silicon nitride, and is in contact with the filler 22 and the sealing member 24 (see FIG. 1).

The first electrode 40, the organic film 60, and the second electrode 70 constitute a light emitting unit 100. An area that the light emitting unit 100 exists is an area where the first electrode 40, the organic film 60, and the second electrode 70 are laminated, and specifically, it is an area inside the opening 50a (or an innermost edge) of the bank 50 in a planar view.

Figure 3:
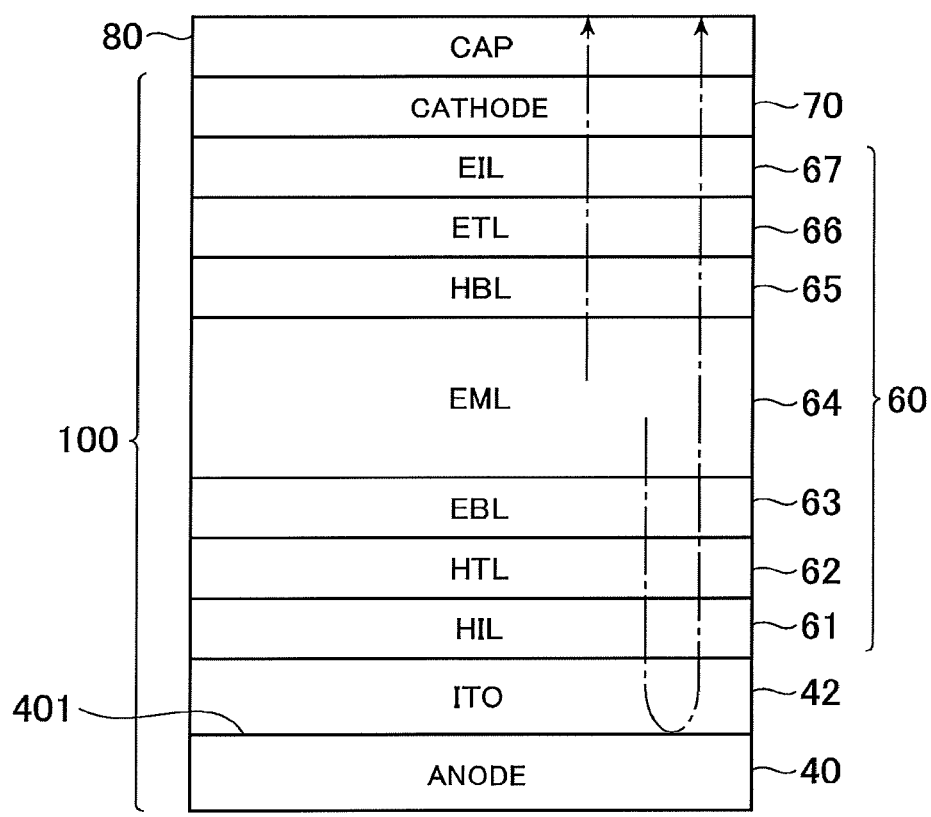
FIG. 3 is a diagram that illustrates an example of a lamination structure of a light emitting unit.

FIG. 3 is a diagram that illustrates an example of a lamination structure of the light emitting unit 100. The light emitting unit 100 is provided with the first electrode 40, a transparent electrode 42, the organic film 60, and the second electrode 70 in order from bottom up. The organic film 60 is provided with a hole injection layer (HIL) 61, a hole transport layer (HTL) 62, an electron block layer (EBL) 63, a light emitting layer (EML) 64, a hole block layer (HBL) 65, an electron transport layer (ETL) 66, and an electron injection layer (EIL) 67 in order from bottom up. This is merely an example, and a lamination structure other than this one may be adopted. As long as the same desired functions can be obtained, it is fine that some of the layers is omitted or replaced with another layer, and a plurality of layers stacked vertically are substituted by another single layer.

A known material is adopted as a material of each layer of the organic film 60. The lamination structure of the organic film 60 is not limited to the above one, and it is sufficient if it includes at least the light emitting layer 64. A color of light emitted by the light emitting layer 64 is not limited to white, and may be another color such as red, green, and blue.

Light that is generated in the light emitting layer 64 and is directed upward penetrates the second electrode 70 and the optical adjusting layer 80, and is directed toward the display surface DS (see FIG. 1). Whereas, light that is generated in the light emitting layer 64 and is directed downward is reflected upward at a reflecting surface 401 of the first electrode 40, penetrates the second electrode 70 and the optical adjusting layer 80, and is directed toward the display surface DS. The light emitting unit 100 has a resonator structure that amplifies light with a specific wavelength between the reflecting surface 401 of the first electrode 40 and the optical adjusting layer 80 or the second electrode 70.

Figure 4:
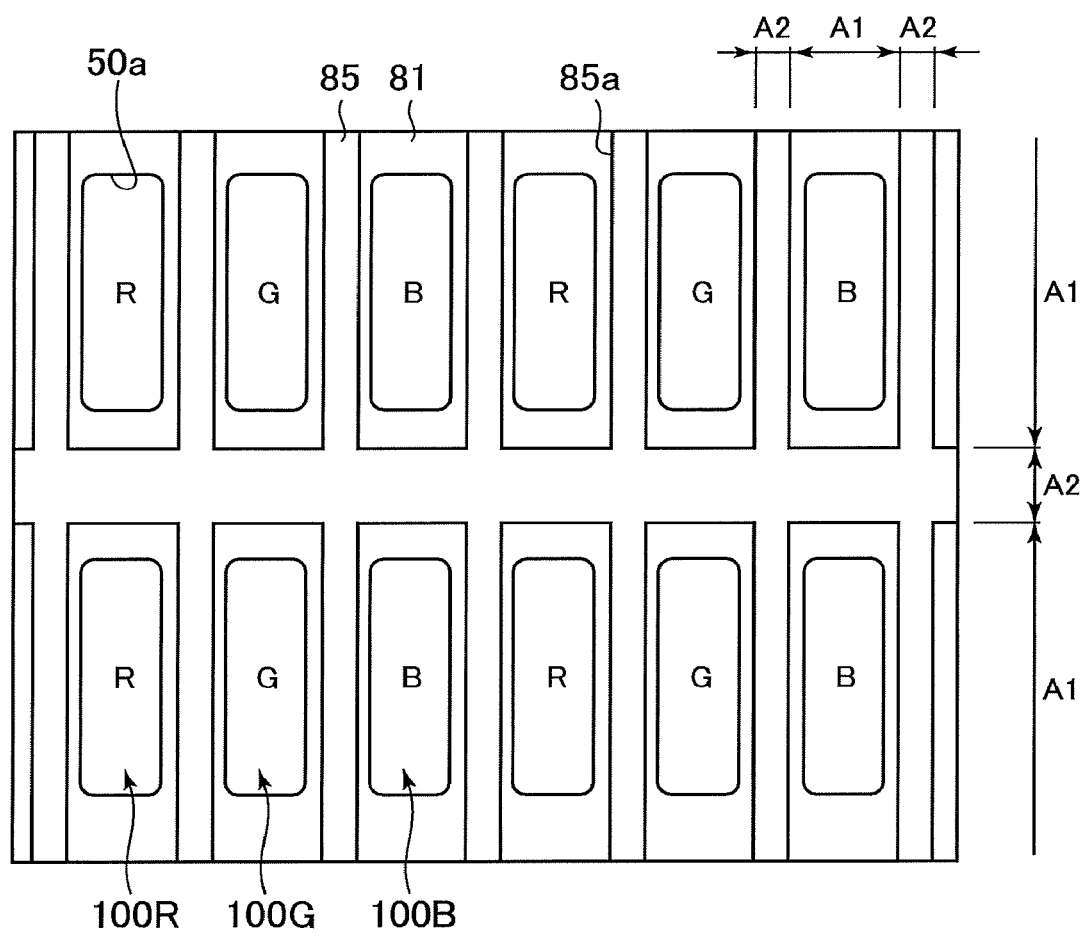
FIG. 4 is a diagram that illustrates an example of a planar structure of the element layer.

FIG. 4 is a diagram that illustrates an example of a planar structure of the element layer 18. The light emitting unit 100 is provided for each subpixel. In the present embodiment, light emitting units 100R, 100G, and 100B of three colors, namely, red, green, and blue, for example are provided. The light emitting units 100R, 100G, and 100B are, for example, arranged so that they appear alternately in a predetermined order in at least one of a row direction and a column direction. It may be configured that the colors of the subpixels are obtained by a color filter provided in the second substrate 20 (see FIG. 1). Further, the size and the number of the subpixels may vary depending on their display color. Also, their arrangement does not have to be a square arrangement, and may be a delta arrangement and a PenTile arrangement.

As illustrated in FIGS. 2 and 4, a number of layers in the optical adjusting layer 80 in a first area A1 that overlaps the light emitting unit 100 in a planar view, and a number of layers in the optical adjusting layer 80 in a second area A2 that is adjacent to the first area A1 are different from each other. Here, the first area A1 is an area that includes the entire light emitting unit 100 in a planar view. The second area A2 is, for example, a peripheral area that surrounds the first area A1, but may have a form other than this, and may also be at least a part of the peripheral area.

The optical adjusting layer 80 includes a first film 81 and a second film 85 that overlap each other. The optical adjusting layer 80 includes the first film 81 and the second film 85 in the second area A2, and the optical adjusting layer 80 includes the first film 81 but does not include the second film 85 in the first area A1. The optical adjusting layer 80 may be configured such that the first film 81 is on an upper side, and the second film 85 is on a lower side, and vice versa.

The second film 85 covers an upper surface of the bank 50, and has an opening 85a that includes the entire opening 50a of the bank 50 in a planar view. Due to this configuration, the first area A1 includes only the first film 81, and the second area A2 includes both of the first film 81 and the second film 85. That is, an area inside the opening 85a of the second film 85 in a planar view is the first area A1, and the area other than that area is the second area A2.

The first film 81 or the second film 85 may be formed of a conductive material, an inorganic material, and an organic material. The details of a combination of materials of the first film 81 and the second film 85 will be described later.

In a case they are formed of a conductive material, the first film 81 or the second film 85 is formed of a transparent conductive material such as magnesium silver (MgAg), indium zinc oxide (IZO), and indium tin oxide (ITO) as the second electrode 70, or a metal material such as Al and Ag. Their thicknesses are, for example, several nm to several hundred nm.

In a case they are formed of an inorganic material, the first film 81 or the second film 85 is formed of a fluoride (e.g., LiF, $MgF_2$, $CaF_2$, and $BaF_2$, etc.), a silicon oxide (e.g., $SiO_2$, etc.), or the like. Their thicknesses are, for example, several tens nm to several hundred nm.

If formed of an organic material, the first film 81 or the second film 85 is formed of a general organic material such as Alq3 (Tris(8-hydroxyquinolinato)aluminium) and NPB (4,4'-Bis[N-(1-naphthyl)-N-phenylamino]biphenyl), or an organic material that is the same as a material of one of the layers 61 to 67 that constitute the organic film 60. Further, they may be formed of an organic material whose refractive index is adjusted, also. Their thicknesses are, for example, several tens nm to several hundred nm.

Note that the sealing film 90 that covers the optical adjusting layer 80 is foiled of an inorganic material such as silicon oxide and silicon nitride, and its thickness is, for example, several hundred nm to several μm. The optical adjusting layer 80 is sufficiently thin as compared with the sealing film 90.

On the organic EL display device of the present embodiment that is provided with the optical adjusting layer 80 as described above, the number of layers in the optical adjusting layer 80 that light FL that is emitted from the light emitting unit 100 and travels in a front direction penetrates, and the number of layers in the optical adjusting layer 80 that light TL that travels in an oblique direction penetrates are different from each other. Specifically, the light FL that travels in the front direction penetrates the first film 81 only, and the light TL that travels in the oblique direction penetrates both of the first film 81 and the second film 85. Here, the light emitting unit 100 is foiled inside the opening 50*a* of the bank 50, the second film 85 covers the upper surface of the bank 50, and the second film 85 is positioned higher than the light emitting unit 100. Therefore, the light TL that travels in the oblique direction which covers a relatively wide angle range easily penetrates the two layers, the first film 81 and the second film 85.

According to such a configuration, by adjusting film thicknesses and refractive indices of the first film 81 and the second film 85, it becomes possible to improve an extraction efficiency of the light TL that travels in the oblique direction, and improve the luminance/visual angle characteristics. For example, if an adjustment is made such that light reflected downward at an interface between the sealing film 90 and the second film 85 is reflected at an interface between the second film 85 and the first film 81 to go upward again, the extraction efficiency of the light TL that travels in the oblique direction improves. Further, if an adjustment is made to satisfy the conditions with which the light that is repeatedly reflected at the interfaces is strengthened like this, the extraction efficiency of the light TL that travels in the oblique direction improves.

In a case where the extraction efficiency of the light TL that travels in the oblique direction is improved, it is preferable that a refractive index of a film located on the lower side from among the first film 81 and the second film 85 (in the example illustrated in FIG. 2, the first film 81) is larger than that of a film located on the upper side (in the example illustrated in FIG. 2, the second film 85). Further, it is preferable that the refractive indices of the first film 81 and the second film 85 are larger than that of the second electrode 70.

Meanwhile, it is possible to intentionally lower the extraction efficiency of the light TL that travels in the oblique direction, depending on how to adjust the film thicknesses, the refractive indices, and the like of the first film 81 and the second film 85. According to this, it is possible to prevent another person from peeping in obliquely.

Further, it is possible to both improve and lower the extraction efficiency of the light FL that travels in the front direction, depending on how to adjust the film thickness, the refractive index, and the like of the first film 81. Therefore, by combining the improving or the lowering of the extraction efficiency of the light TL that travels in the oblique direction and the improving or the lowering of the extraction efficiency of the light FL that travels in the front direction, it is possible to have desired luminance/visual angle characteristics.

In the embodiment that has been described above, the number of layers in the optical adjusting layer 80 in the first area A1 and the number of layers in the optical adjusting layer 80 in the second area A2 are different from each other. However, the configuration is not limited to this, and even in a case where only one layer constitutes the optical adjusting layer 80 as a whole, as long as at least one of the film thickness and the refractive index at the first area A1 and that at the second area A2 are different from each other, the same effect can be obtained. For example, if an adjustment is made so as to satisfy the conditions with which the light that is repeatedly reflected in the second area A2 between the upper surface and the lower surface of the optical adjusting layer 80 is intensified, the extraction efficiency of the light TL that travels in the oblique direction improves.

Here, a supplementary explanation is given as to functions and roles of the optical adjusting layer 80.

Firstly, a case is considered where the optical adjusting layer is constituted by only one layer (only a CAP1). In the normal configuration in which the optical adjusting layer is not given, for example, in a configuration where cathode metal (the second electrode 70), an inorganic passivation (the sealing film 90), resin (the filler 22) are laminated in order from bottom up, generally, the refractive index of the inorganic passivation is the largest one, and the refractive index of the resin is the second largest one, and the refractive index of the cathode metal is the smallest one. The refractive indices of the cathode metal/the inorganic passivation/the resin with respect to the wavelength of 550 nm are, for example, around 0.17/1.8/1.5.

Here, an optical adjusting layer (e.g., an organic film) with the refractive index higher than that of the inorganic passivation is inserted between the cathode metal and the inorganic passivation. If the refractive index of the optical adjusting layer with respect to the wavelength of 550 nm is, for example, 2.0, the refractive indices of the cathode metal/the optical adjusting layer/the inorganic passivation/the resin with respect to the wavelength of 550 nm becomes, for example, around 0.17/2.0/1.8/1.5. In this configuration, as compared with the normal configuration as above, the difference between the refractive index of the cathode metal and the refractive index of the layers over it becomes large. Therefore, the light that returns to the anode side from the cathode metal (transmission light) decreases, and as a result, the extraction efficiency of the light improves.

Next, a case is considered where the optical adjusting layer includes two layers (CAP1+CAP2). In addition to the configuration where the optical adjusting layer described above is constituted by only one layer (only the first optical adjusting layer), a second optical adjusting layer (e.g., an inorganic film) with the refractive index lower than that of the two is inserted between the first optical adjusting layer and the inorganic passivation. If the refractive index of the second optical adjusting layer with respect to the wavelength of 550 nm is, for example, 1.36, the refractive indices of the cathode metal/the first optical adjusting layer/the second optical adjusting layer/the inorganic passivation/the resin with respect to the wavelength of 550 nm become, for example, around 0.17/2.0/1.36/1.8/1.5. In this configuration, there are relatively large differences in the refractive indices between the first optical adjusting layer and the second optical adjusting layer, and between the second optical adjusting layer and the inorganic passivation.

Accordingly, in addition to the decrease of the light that returns to the anode side from the cathode metal as described above, a multiple optical interference effect is strengthened, and thus an improve of the extraction efficiency of the light can be expected, as compared with the case where the optical adjusting layer is constituted by only one layer. Therefore, if there is the optical adjusting layer constituted by one layer, the extraction efficiency is higher than that in a case where there is no optical adjusting layer, and if there is the optical adjusting layer constituted by two layers, the extraction efficiency is higher than that in a case where there is the optical adjusting layer constituted by one layer.

In the embodiment described above, the balance of the light intensity in the front direction and the light intensity in the oblique direction, for example, are adjusted, by making use of the difference in the extraction efficiency of the light caused by the difference in the number of layers in the optical adjusting layer as above.

Below, an example of a combination of materials of the first film 81 and the second film 85 is explained. A detailed explanation is omitted by applying the same reference symbol for an element that is the same as the one in the configuration as above.

Figure 5:
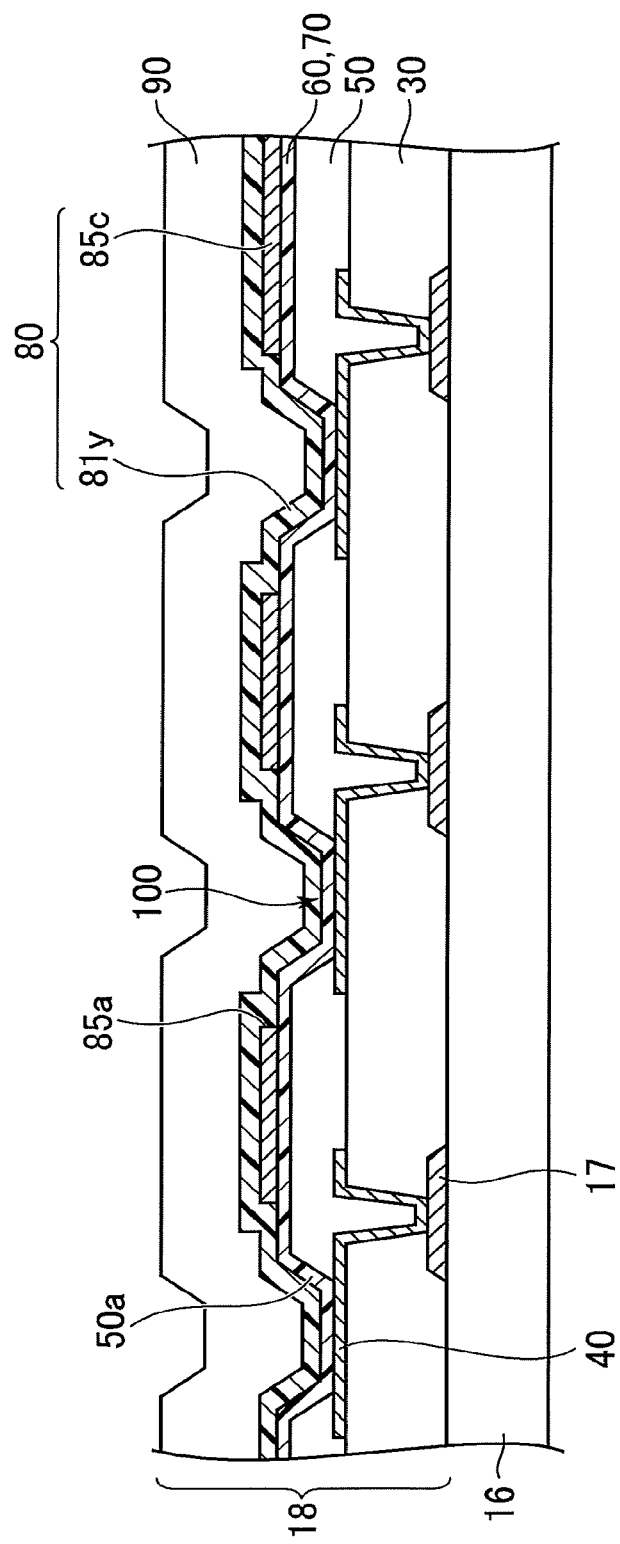
FIG. 5 is a diagram that illustrates a first embodiment of an optical adjusting layer.

FIG. 5 is a diagram that illustrates a first embodiment of the optical adjusting layer 80. In this example, a second film 85*c* that has the opening 85*a* and is formed of a conductive material is disposed on the lower side, and the first film 81*y* formed of an organic material is disposed on the upper side. Here, the second film 85*c* disposed on the lower side is provided so as to be in contact with the second electrode 70 that covers the upper side of the bank 50. Therefore, it is possible to decrease the wiring resistance of the second electrode 70.

Figure 6:
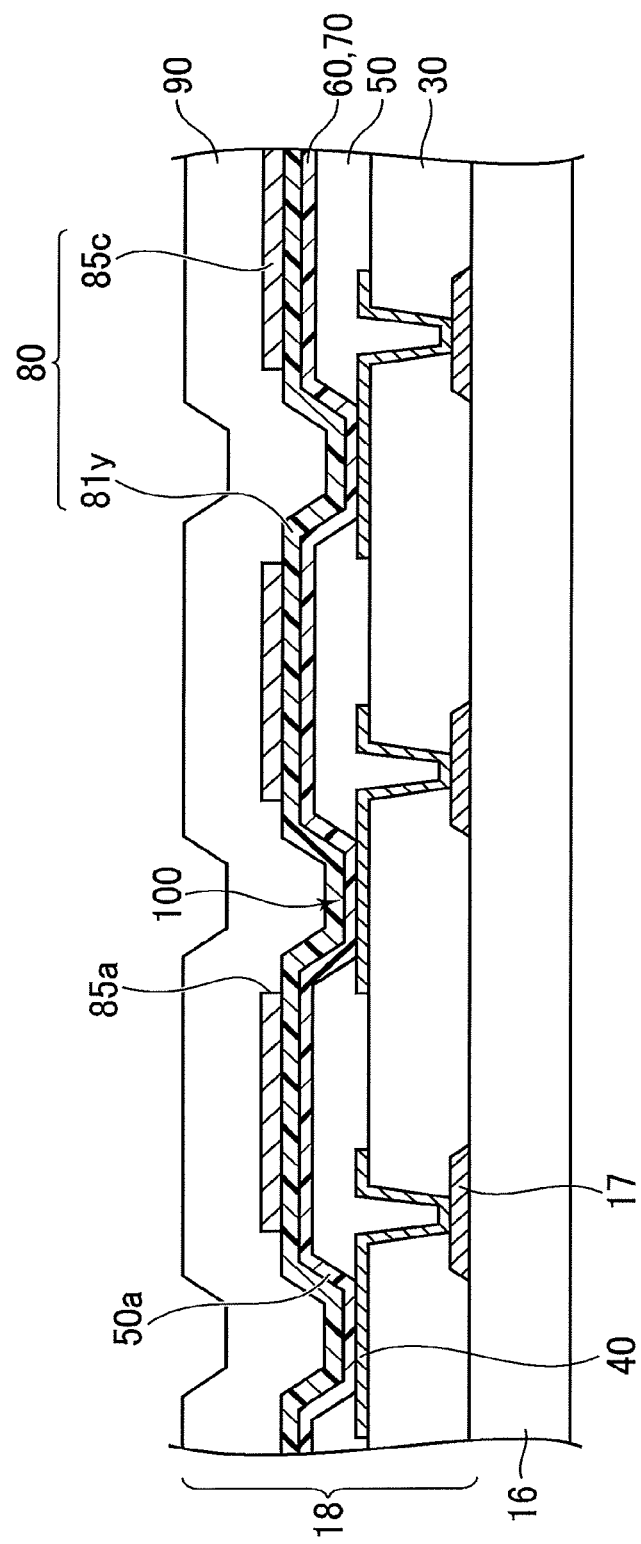
FIG. 6 is a diagram that illustrates a second embodiment of the optical adjusting layer.

FIG. 6 is a diagram that illustrates a second embodiment of the optical adjusting layer 80. In this example, the first film 81*y* formed of an organic material is disposed on the lower side, and the second film 85*c* that has the opening 85*a* and is formed of a conductive material is disposed on the upper side. Here, the second film 85*c* that is disposed on the upper side is provided on the first film 81*y* formed of the organic material and is not in contact with the second electrode 70. Thus it is in a floating state electrically.

Figure 7:
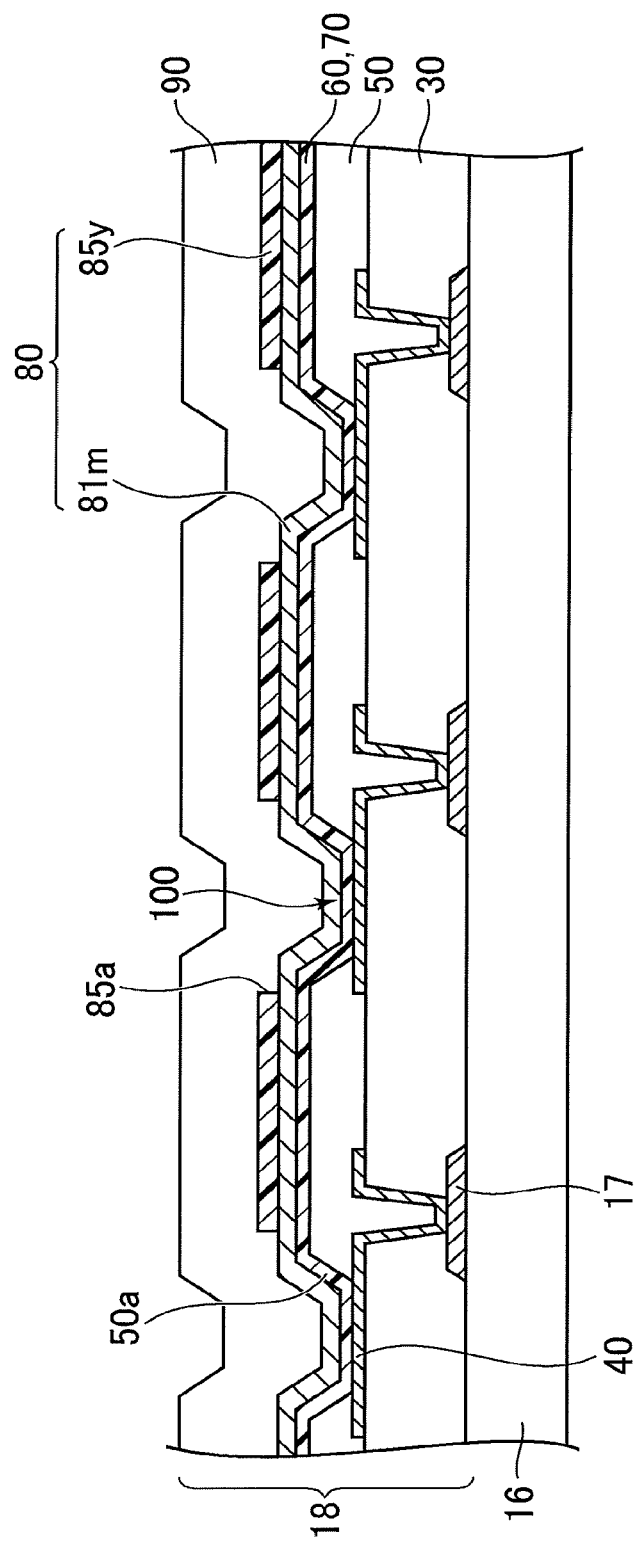
FIG. 7 is a diagram that illustrates a third embodiment of the optical adjusting layer.

FIG. 7 is a diagram that illustrates a third embodiment of the optical adjusting layer 80. In this example, the first film 81*m* formed of an inorganic material is disposed on the lower side, and the second film 85*y* that has the opening 85*a* and is formed of an organic material is disposed on the upper side.

Figure 8:
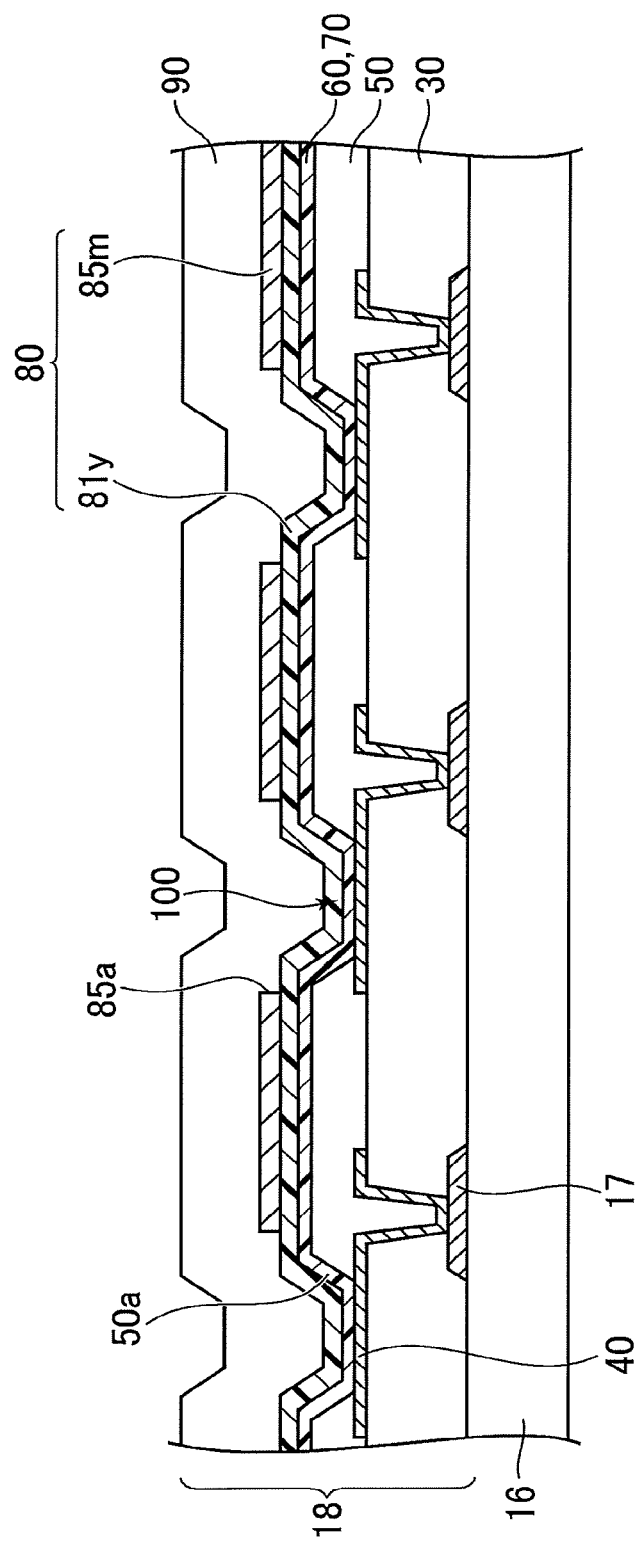
FIG. 8 is a diagram that illustrates a fourth embodiment of the optical adjusting layer.

FIG. 8 is a diagram that illustrates a fourth embodiment of the optical adjusting layer 80. In this example, the first film 81*y* formed of an organic material is disposed on the lower side, and the second film 85*m* that has the opening 85*a* and is formed of an inorganic material is disposed on the upper side.

Figure 9:
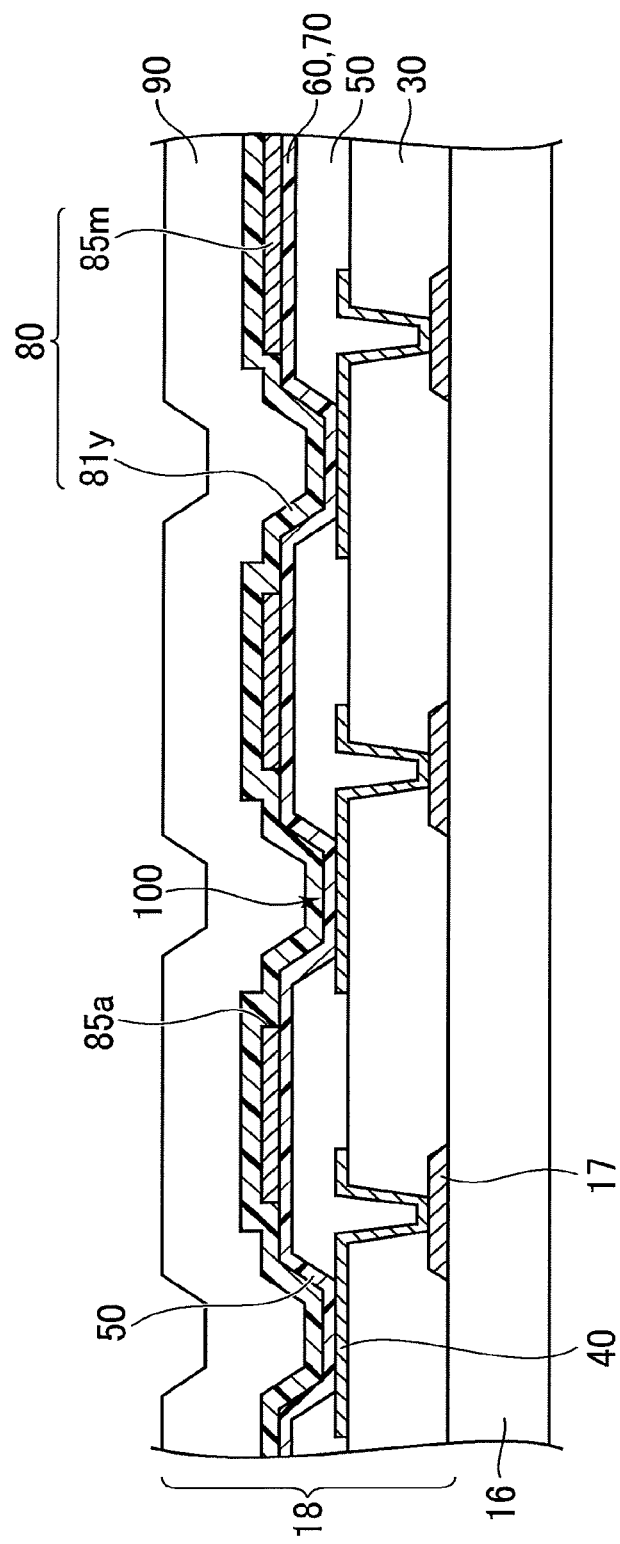
FIG. 9 is a diagram that illustrates a fifth embodiment of the optical adjusting layer.

FIG. 9 is a diagram that illustrates a fifth embodiment of the optical adjusting layer 80. In this example, the second film 85*m* that has the opening 85*a* and is formed of an inorganic material is disposed on the lower side, and the first film 81*y* formed of an organic material is disposed on the upper side.

Figure 10:
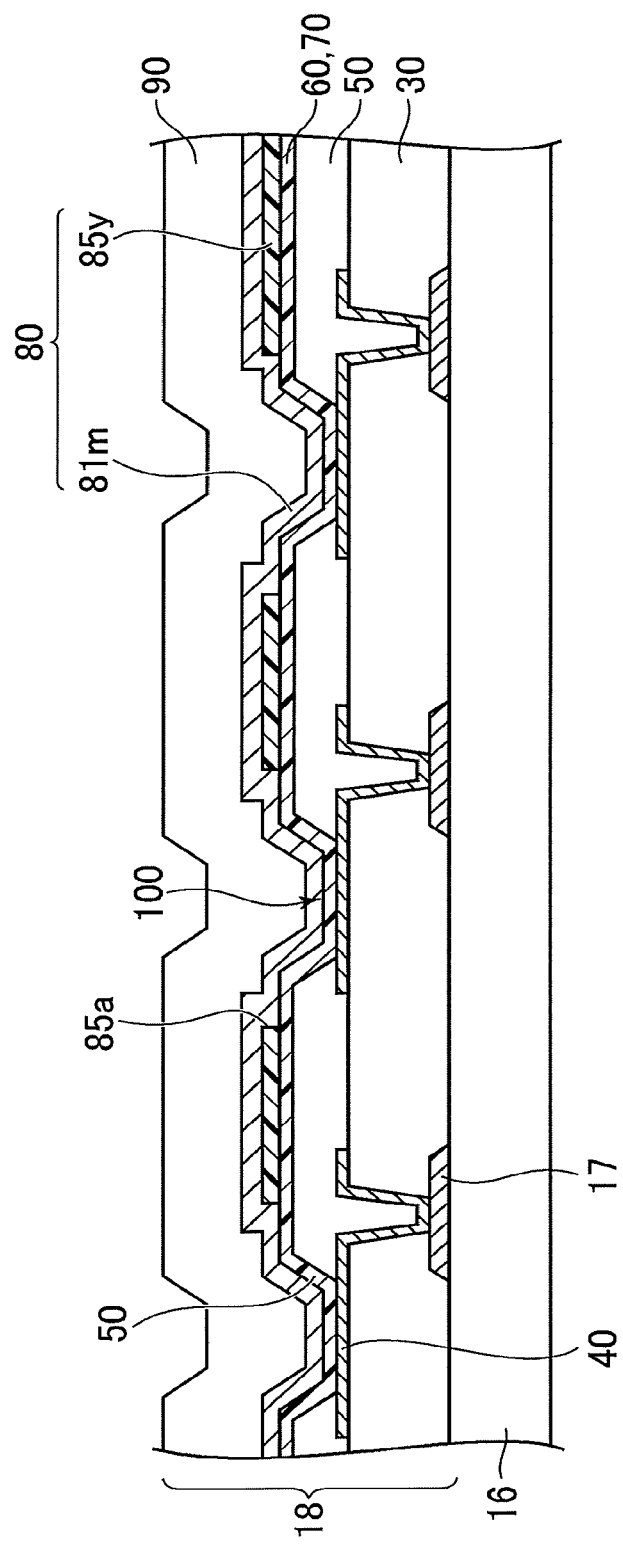
FIG. 10 is a diagram that illustrates a sixth embodiment of the optical adjusting layer.

FIG. 10 is a diagram that illustrates a sixth embodiment of the optical adjusting layer 80. In this example, the second film 85*y* that has the opening 85*a* and is formed of an organic material is disposed on the lower side, and the first film 81*m* formed of an inorganic material is disposed on the upper side.

Figure 11:
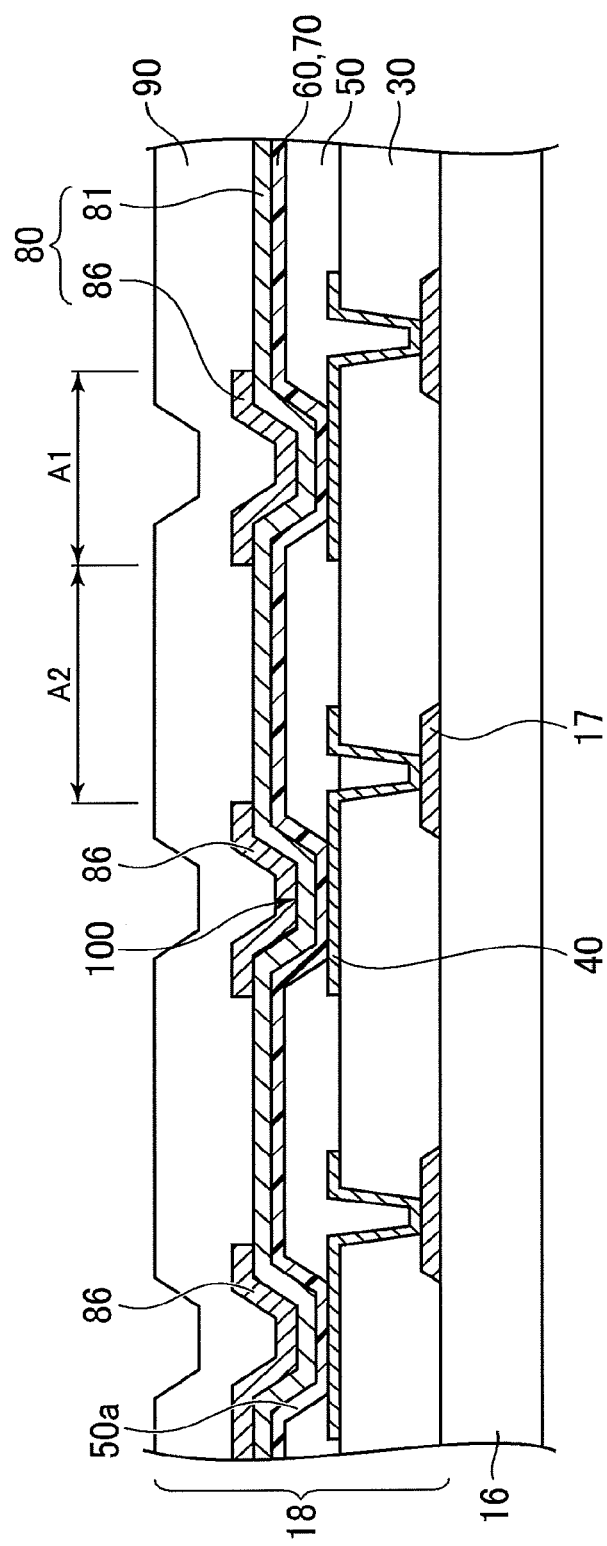
FIG. 11 is a diagram that illustrates a first variation of the optical adjusting layer.

FIG. 11 is a diagram that illustrates a first variation of the optical adjusting layer 80. In this example, contrary to the embodiments described above, the optical adjusting layer 80 includes the first film 81 and the second film 86 in the first area A1, and the optical adjusting layer 80 includes the first film 81 but does not include the second film 86 in the second area A2. The second film 86 is formed so as to fill the opening 50*a* of the bank 50 and covers the light emitting unit 100.

Due to this configuration, the number of layers in the optical adjusting layer 80 that the light emitted from the light emitting unit 100 in the front direction penetrates and the number of layers in the optical adjusting layer 80 that the light that travels in the oblique direction penetrates are different from each other. Thus it is possible to both improve and lower the extraction efficiency of the light that travels in the oblique direction, and it is also possible to both improve and lower the extraction efficiency of the light that travels in the front direction.

Figure 12:
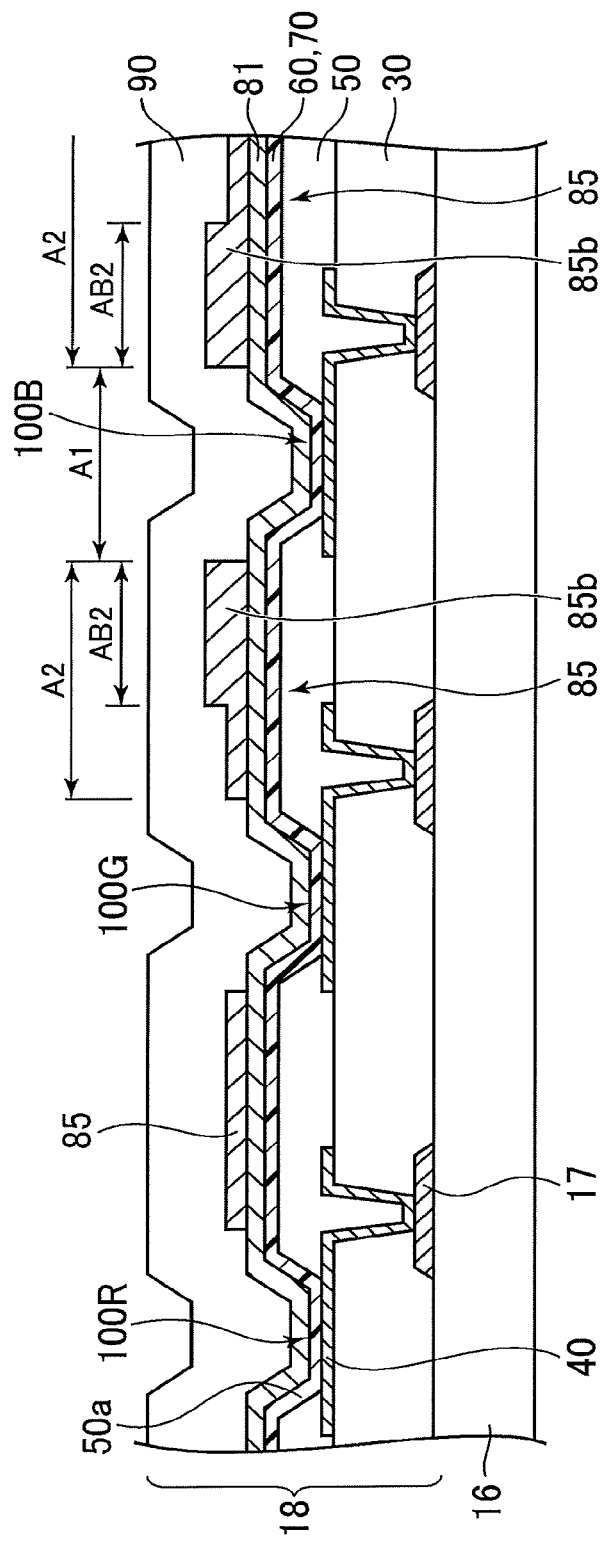
FIG. 12 is a diagram that illustrates a second variation of the optical adjusting layer.

FIG. 12 is a diagram that illustrates a second variation of the optical adjusting layer 80. As in this example, the regions in the second areas A2 that respectively correspond to the light emitting units 100R, 100G, and 100B of the respective colors might be different from one another in at least one of the number of layers, the film thickness, and the refractive index.

Specifically, in this example, in the second area A2, the film thickness of an area AB2 that corresponds to the blue light emitting unit 100B is different from that of the other areas. The area AB2 is a peripheral area that surrounds the first area A1 that corresponds to the blue light emitting unit 100B, but the configuration is not limited to this one, and the area AB2 may be at least a part of the peripheral area. Further, in at least one of the number of layers and the refractive index, the area AB2 may be different from that of the other areas.

Due to this, in the second area A2, in the areas that respectively correspond to the light emitting units 100R, 100G, and 100B of the respective colors, the film thickness, the refractive index, and the like can be adjusted in accordance with the wavelength of the light that penetrates them. For example, in the second area A2, the film thickness, refractive index, and the like of the area AB2 that corresponds to the blue light emitting unit 100B can be adjusted so that they are appropriate for the wavelength of the blue light, and the film thickness, the refractive index, and the like of the other areas can be adjusted so that they are appropriate for the wavelengths of the red light and green light.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
at least one light emitting unit that comprises a first electrode that includes a reflecting surface, an organic film that comprises a light emitting layer and is provided over the first electrode, and a second electrode that is provided over the organic film and transmits light from the light emitting layer;
a bank on which a first opening is formed at a bottom of which the first electrode exists, and which includes the organic film inside the first opening; and
an optical adjusting layer that is provided over the second electrode,
wherein a region where the first electrode, the bank, the organic film, the second electrode and the optical adjusting layer are arranged in this order is formed, and
the optical adjusting layer is in a first area and at least one second area,
the first area overlaps the first opening and an edge of the bank in a planar view,
the at least one second area is surrounded by the first area without overlapping the first area in a planar view,
the optical adjusting layer in the first area is thinner than the optical adjusting layer in the at least one second area, and
the optical adjusting layer in the first area and the optical adjusting layer in the at least one second area are different from each other in at least one of a number of layers or a refractive index,
wherein the optical adjusting layer comprises a first film and a second film that overlaps the first film in one of the first area and the at least one second area,
the optical adjusting layer comprises the first film but does not comprise the second film in the other one of the first area and the at least one second area,
wherein the second film of the optical adjusting layer covers an upper surface of the bank, and on the second film a second opening is formed which entirely includes the first opening in a planar view, and
wherein light emitted from the light emitting unit and that travels in an orthogonal direction to a surface of the at least one light emitting unit penetrates the first film, and light emitted from the light emitting unit and that travels in an oblique direction to the surface of the light emitting unit penetrates both the first film and the second film.

2. The organic EL display device according to claim 1, wherein one of the first film and the second film that is disposed on a lower side has a refractive index larger than that of the other one that is disposed on an upper side.

3. The organic EL display device according to claim 1, wherein a refractivity of the optical adjusting layer is larger than that of the second electrode.

4. The organic EL display device according to claim 1, wherein the second electrode covers an upper surface of the bank, and
the second film of the optical adjusting layer is formed of a conductive material and is provided so as to be in contact with the second electrode.

5. The organic EL display device according to claim 1, wherein the at least one light emitting unit comprises a plurality of light emitting units that emit lights of colors that are different from one another, and
the at least one second area comprises a plurality of second areas that respectively correspond to the plurality of light emitting units, and the plurality of second areas are different from one another in at least one of a number of layers that each second area has, a film thickness, and a refractive index.

6. The organic EL display device according to claim 1, further comprising:
a sealing film that covers the optical adjusting layer.

* * * * *